United States Patent
Bohl et al.

(10) Patent No.: US 8,104,015 B2
(45) Date of Patent: *Jan. 24, 2012

(54) SYSTEM AND METHOD FOR AUTOMATED ELECTRONIC DEVICE DESIGN

(75) Inventors: Richard L. Bohl, Austin, TX (US); Jeffrey K. Roane, Round Rock, TX (US)

(73) Assignee: Prophicy Semiconductor, Inc., Round Rock, TX (US)

( * ) Notice: Subject to any disclaimer, the term of this patent is extended or adjusted under 35 U.S.C. 154(b) by 334 days.

This patent is subject to a terminal disclaimer.

(21) Appl. No.: 12/429,932

(22) Filed: Apr. 24, 2009

(65) Prior Publication Data

US 2009/0292383 A1 Nov. 26, 2009

Related U.S. Application Data

(63) Continuation of application No. 11/502,029, filed on Aug. 10, 2006, now Pat. No. 7,526,740, which is a continuation of application No. 10/717,027, filed on Nov. 19, 2003, now Pat. No. 7,146,586.

(60) Provisional application No. 60/427,474, filed on Nov. 19, 2002.

(51) Int. Cl.
G06F 17/50 (2006.01)
(52) U.S. Cl. ......... 716/136; 716/100; 716/106; 716/112
(58) Field of Classification Search .................. 716/100, 716/106, 112, 136; 700/103, 109, 121
See application file for complete search history.

(56) References Cited

U.S. PATENT DOCUMENTS

| | | | |
|---|---|---|---|
| 3,777,129 A | 12/1973 | Mehia | |
| 6,185,707 B1 | 2/2001 | Smith et al. | |
| 6,553,554 B1 | 4/2003 | Dahl et al. | |
| 6,557,153 B1 | 4/2003 | Dahl et al. | |
| 6,564,363 B1 | 5/2003 | Dahl et al. | |
| 6,564,364 B1 | 5/2003 | Dahl et al. | |
| 6,574,788 B1 | 6/2003 | Levine et al. | |
| 7,146,586 B2 | 12/2006 | Bohl et al. | |
| 7,526,740 B2 | 4/2009 | Bohl et al. | |
| 2002/0093525 A1 | 7/2002 | Asauchi | |
| 2002/0166082 A1 | 11/2002 | Ramadei et al. | |
| 2003/0149919 A1 | 8/2003 | Greenwald et al. | |
| 2006/0271892 A1 | 11/2006 | Bohl et al. | |
| 2008/0222582 A1 | 9/2008 | Bohl et al. | |

FOREIGN PATENT DOCUMENTS

WO WO 2004051520 A2 6/2004

OTHER PUBLICATIONS

International Search Report issued in PCT/US03/037168 on May 21, 2004, Prophicy Semiconductor, 4 pages.
Office Action issued in U.S. Appl. No. 10/717,027 dated Jan. 24, 2006, Bohl, 7 pages.
Office Action issued in U.S. Appl. No. 11/502,029 dated Jan. 16, 2008, Bohl, 8 pages.

(Continued)

*Primary Examiner* — Sun Lin
(74) *Attorney, Agent, or Firm* — Sprinkle IP Law Group

(57) ABSTRACT

A system for the automated formation and control and execution of an electronic device design flow is disclosed which can enable more efficient electronic device design methodology with higher quality of results. Such a system as analysis methods, techniques, and tools, a knowledge database, a design database, a controller and reasoner, are described.

20 Claims, 3 Drawing Sheets

OTHER PUBLICATIONS

Office Action issued in U.S. Appl. No. 11/502,029 dated Jul. 2, 2008, Bohl, 6 pages.

Office Action issued in U.S. Appl. No. 12/121,206, mailed Jun. 18, 2010, 10 pages.

"The History of the Integrated Circuit", Nobelprize.org, first published May 5, 2003, retrieved on Sep. 17, 2010 from <http://nobelprize.org/ educational/physics/integrated_circuit/history/>, 6 pgs.

"1958: Invention of the Integrated Circuit," retrieved on Sep. 17, 2010 from <http://www.pbs.org/transistor/background1/events/icinv.html/>, 2 pgs.

Notice of Allowance for U.S. Appl. No. 12/121,206, mailed Sep. 29, 2010, 5 pgs.

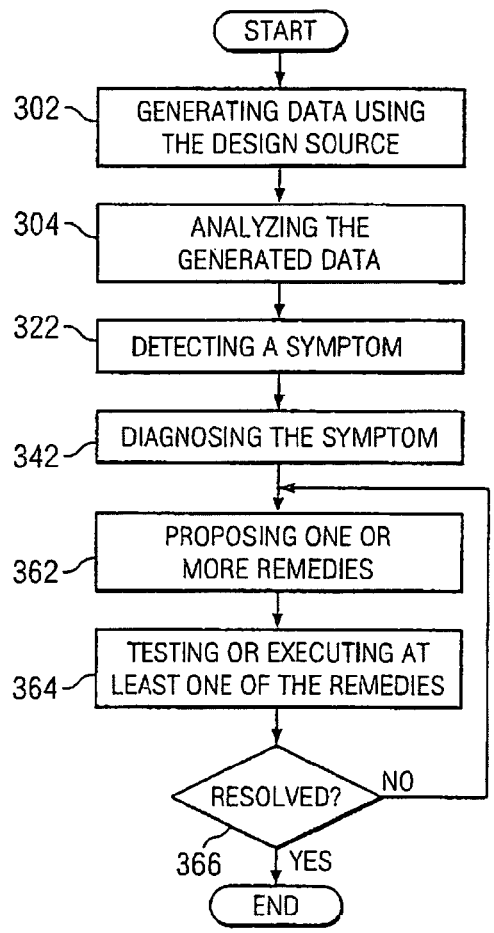
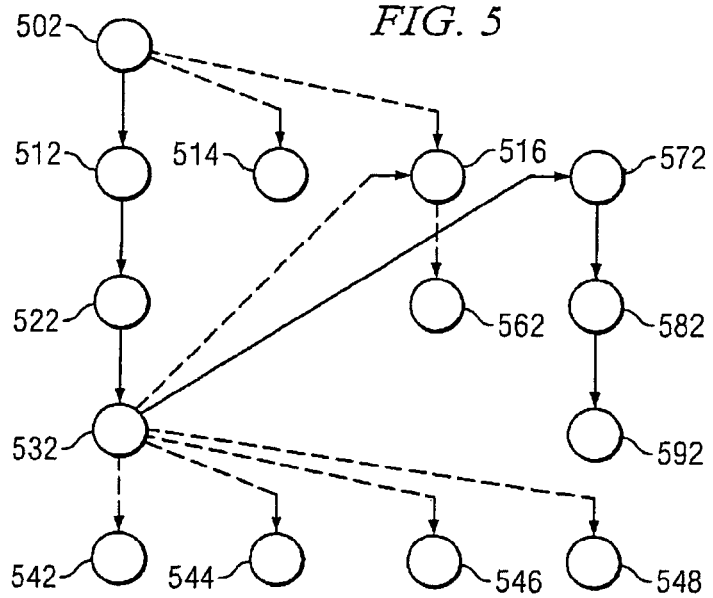

SYSTEM AND METHOD FOR AUTOMATED ELECTRONIC DEVICE DESIGN

RELATED APPLICATIONS

This is a continuation of U.S. patent application Ser. No. 11/502,029, entitled "System and Method for Automated Electronic Device Design" by Richard L. Bohl and Jeffrey K. Roane, filed on Aug. 10, 2006, now U.S. Pat. No. 7,526,740, issued on Apr. 28, 2009, which was a continuation of U.S. patent application Ser. No. 10/717,027, now U.S. Pat. No. 7,146,586, issued on Dec. 5, 2006, entitled "System and Method for Automated Electronic Device Design" by Richard L. Bohl and Jeffrey K. Roane, filed on Nov. 19, 2003, which claims priority under 35 U.S.C. §119(e) to U.S. Provisional Patent Application No. 60/427,474, entitled "System and Method for Automated IC Design System" by Richard L. Bohl and Jeffrey K. Roane, filed on Nov. 19, 2002, all of which are assigned to the current assignee hereof and incorporated herein by reference.

FIELD OF THE INVENTION

The invention relates in general to systems and methods for designing electronic devices, and more particularly, to systems and methods for automating the design of electronic devices including electronic semiconductor devices.

DESCRIPTION OF THE RELATED ART

Even though Electronic Design Automation (EDA) tools have made considerable progress in automating many of the previously manual design activities, semiconductor process technology and escalating circuit densities combine to make design an increasingly complicated and expensive undertaking. As semiconductor device technology trends toward smaller devices, greater levels of expertise are required to successfully execute an increasingly complicated design flow. Many design projects are ill equipped to efficiently achieve success on an electronic design project, due at least in part to the scarcity of expert designers.

Conventional electronic device design practice, particularly for integrated circuit ("IC") design, is a highly-interactive and manual process that uses expert designers, who are highly-skilled, experienced people who are familiar with the behavior of the various commercially available and the design groups' proprietary electronic design automation tools (EDA tools). These expert designers are very knowledgeable about design and the behavior of the individual EDA tools that are used to automate the design. They use this knowledge to identify and resolve the impediments to completing a design such that the resultant design implementation meets all of the constraints on the design (e.g., clock frequency, power envelope, performance, functionality, and anything that pertains to the electrical correctness of the resulting electronic device).

Current electronic design solutions are driven by these highly-knowledgeable individuals who interact with EDA tools and the design at various points in the design flow. Normally, the design flow is under the control of a software program, or control script, that runs through a statically determined path or sequence of EDA tools and EDA tool commands. Normally reports are generated at various points in the design flow that compare design performance against constraints and identify exceptions and warnings such as design rule or electrical violations.

Electronic device design is in effect a complex process control problem, requiring multiple passes through design tools and knowledgeable and experienced designers to control the process or flow. Invariably intermediate results fail to meet constraints or contain design rule or electrical violations. To resolve these deficiencies designers must analyze the design and determine where and how to effect change through modification of either the design, the EDA tool control programs, or both. That determination is a difficult, time consuming, and iterative process even for experienced designers. Alternatively, designers may recommend to the originating design group that the design be re-architected, if the existing architecture proves infeasible using a specific implementation technology.

FIG. 1 illustrates a conventional design system 100 to better illustrate some of the previously described points. Substantial amounts of human intervention 120 are needed. Typically, a designer captures a design description using a hardware description language (HDL). That description is typically stored in a design database 142. Another designer may create script files 144, which are files that contain software instructions for operating EDA tools. The design and script files are processed in a series of predetermined, static steps 148. Human intervention can occur before, during, or after each step. The designer may not know of the idiosyncrasies or intricacies of the EDA tools, and likewise, the person writing the script files may not know of the idiosyncrasies or intricacies of the design. Furthermore, neither may efficiently address the problems.

As design complexity grows, the conventional design system 100 and methods become even more difficult to manage due to the exponential growth in design data that must be analyzed and managed by designers. Therefore conventional design methods may become impractical due to cost and schedule impact.

SUMMARY OF THE INVENTION

The methods and systems described herein can automatically (or in a partially automated manner) formulate and control execution of an electronic device design flow, provide guidance to an electronic device designer executing an electronic device design flow, or a combination thereof. The method and system can automatically define steps to be executed, an order of execution, and execute and suspend the steps. The method and system can automatically perform expert analysis and remedial action including preparation and application of input to design automation tools, programs, and techniques that analyze or modify the design, design constraints, environment, operating data, or the like.

The method and system can also include a control and reasoning method which can perform reasoning across multiple implementation trials of a design (e.g., an electronic design) and stored expert design knowledge for a purpose of automatically selecting and controlling (or providing operator guidance in selecting and controlling) design automation tools to more efficiently perform electronic design implementation and verification. In one embodiment, reasoning can be implemented using a software program that associates at least one observed symptom with at least one remedy or associates at least one potential root cause with at least one observed symptom.

Reasoning may be performed using stored expert knowledge and a knowledge base. The knowledge database may provide automated or expert guidance for the selection of analysis methods, the diagnosis of a design, the selection of remedial methods, or any combination thereof. The knowledge base may also provide information for the selection of tools and resultant process flow.

The method and system can allow for the storing of the design, including initial, intermediate, and complete versions of the design, in various formats required by the overall system or any components) thereof. The method and system can allow for the storing of design constraints and all data collected during the design process.

The method and system can perform an analysis (including analyzing in-progress information), of a design for the purpose of determining the condition of a design in various stages of implementation including but not limited to register transfer level, unmapped structural or Boolean equation, mapped structural, fully or partially placed, fully or partially routed, fully or partially electrically correct, etc., for a purpose of automatically determining remedial actions to apply to produce a completed design which meets design goals or for a purpose of identifying root causes of design maladies.

The method and system can perform abstraction of analysis results produced by the system, for a purpose of determining the root causes of design maladies, for a purpose of facilitating production of expert guidance or for a purpose of facilitating automatic selection and execution of design automation tools.

The method and system can also formulate jobs and automatically execute the jobs on individual or multiple computers or multiple central processing units of a computer or multiple computers.

The method and system can automatically affect change on a design at any point in the design flow for a purpose of moving a design toward completion or to remedy a design malady.

In one embodiment, the system can comprise a set of software programs that operate on a computer workstation. For one embodiment, the operation can be described as follows:

Design source can be read into the system. The design source may comprise a set of files or design database containing any mix of hardware description language or logical or physical representation of the design, a set of files or design database containing the design libraries used or targeted, a set of files containing design constraints which describe the timing, physical, electrical, environmental targets, or any combination thereof.

Analysis can be performed on the design source and the system can determine whether the design source is sufficient to begin processing. If the design source is insufficient, the system may direct the operator to the area where augmentation or modification of the design source is required. Additionally, the system may perform or recommend a remedial action to improve the design source.

Upon successful completion of design source pre-processing, the system performs analysis to determine the method of automatically processing the design to meet the target constraints. The system formulates a sequence of design processing steps based on analysis of the design source, expert knowledge stored in the system, and optionally operator input. Jobs can then be dispatched using an execution manager, which formulates and dispatches jobs on a single or networked computer system for execution.

The system and method may continue, modify, or abort execution, based on guidance from the system's central controller and reasoning function, optional operator input, or both. The controller and reasoning function performs expert reasoning using stored expert knowledge and analysis information collected before, during, and after execution of steps in the sequence of steps that comprise a design flow. System control includes automatically determining the operations, and their sequence of execution, that are to be performed to achieve target constraints, automatically creating and applying remedial methods to modify the design source or design automation tool control input, automatically determining when to notify the operator to request operator-intervention, automatically creating reports that guide the operator to the area requiring the intervention, or any combination thereof.

In one set of embodiments, a computer-implemented method of designing an electronic device can comprise detecting at least one symptom of an electronic device design, diagnosing the symptoms and proposing at least one remedy to be applied to the electronic device design, or associating at least one root cause for the diagnosed symptoms.

In another set of embodiments, a computer-implemented method of designing an electronic device can comprise reaching a decision point, wherein potential remedies comprise a first remedy and a second remedy. The method can also comprise selecting the first remedy and executing on the first remedy at a first step. The method can further comprise backtracking and selecting the second remedy.

In further sets of embodiments, a data processing system readable medium can comprise code that includes instructions for carrying out the methods and may be used on the systems.

The foregoing general description and the following detailed description are exemplary and explanatory only and are not restrictive of the invention, as defined in the appended claims.

BRIEF DESCRIPTION OF THE DRAWINGS

The present invention is illustrated by way of example and not limitation in the accompanying figures.

FIG. 3 includes a process flow diagram that can use the automated electronic device design system of FIG. 2.

FIG. 5 includes a flow diagram for designing an electronic device where a computer-implemented method uses downstream data and results to better formulate upstream design flow steps or remedies to design maladies that occur in the design flow.

DETAILED DESCRIPTION

Figure 1:
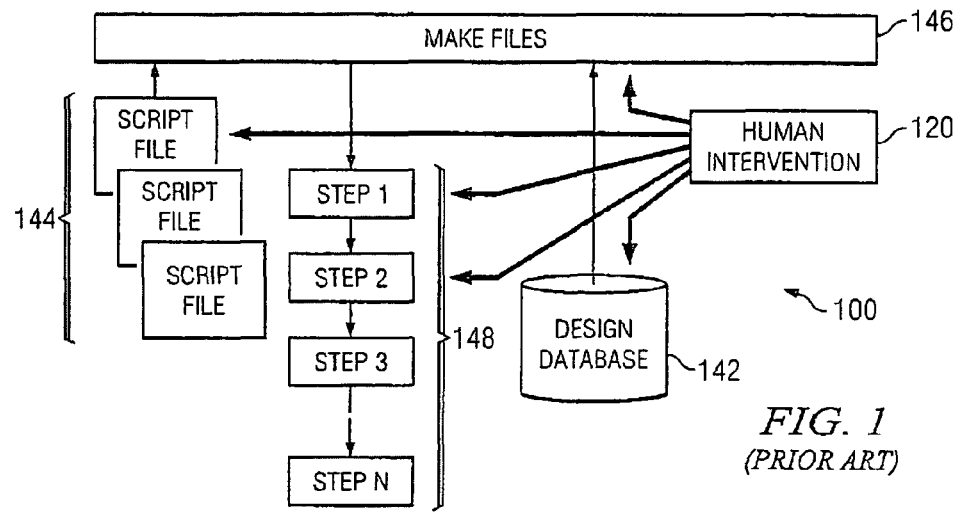
FIG. 1 includes an illustration of a conventional electronic device design system. (Prior art)

Reference is now made in detail to the exemplary embodiments of the invention, examples of which are illustrated in the accompanying drawings. Wherever possible, the same reference numbers will be used throughout the drawings to refer to the same or like parts (elements).

The method and system can mimic the design techniques of expert electronic device designers. Expert designers understand design constructs and what results they are likely to achieve using specific constructs with a given technology. They are also very experienced with the EDA tools. The method and system can use knowledge and observation of both static and dynamic results during and after execution of each design tool or program that defines a design flow. Having used these tools for a number of designs, expert designers are familiar with the tools' behaviors. The method and system can leverage information gleaned from executing a number of designs employing different tools and technologies. The method and system may be configured to operate automatically, provide expert guidance to designers, request operator input, or any combination thereof.

In one embodiment, an automated design system can comprise a control and reasoning unit, a knowledge database, a design database, a sub-system that includes EDA tools, analysis programs, and transforms, an analysis abstraction unit, and a batch job execution controller.

The control and reasoning unit can formulate and control the design flow, mimicking an expert operator. The control and reasoning unit can use stored expert knowledge within the knowledge database. The design database may store initial, intermediate, and completed versions of a design, design constraints, and analysis data collected for a design as it proceeds through the design flow. The analysis abstraction unit can pre-process data extracted from analysis programs that operate on various versions of the design as the design progresses through the design flow. The batch job controller can automatically order and dispatch jobs for execution on a single computer or networked computers. Additional detail on each unit is given later in this document.

In one embodiment, the operation can be described as follows. Design source (design files and design constraint files) can be read into the system. The system may perform or recommend a remedial action to improve the design source. The system may then perform analysis to determine the method of automatically processing the design to meet the target constraints. The system can formulate a sequence of design processing steps based on analysis of the design source, expert knowledge stored in the system, and optionally operator input.

The system and method may continue, modify, or abort execution, based on guidance from the system's central controller and reasoning function, optional operator input, or both. The controller and reasoning function performs expert reasoning using stored expert knowledge and analysis information collected before, during, and after execution of steps in the sequence of steps that comprise the design flow. System control includes automatically determining the sequence of operations that are to be performed to achieve target constraints, automatically creating and applying remedial methods to modify the design source or design automation tool control inputs, automatically determining when to notify the operator to request operator-intervention, automatically creating reports that guide the operator to the area requiring the intervention, or any combination thereof.

A few terms are defined or clarified to aid in understanding the descriptions that follow. The term "abstraction analysis" is intended to mean post processing of raw analysis data such that it is actionable by a system.

The term "computer-implemented method" is intended to mean a method that is at least partly performed by a computer, data processing system, or other machine without human intervention except potentially at a limited number of predetermined points.

The term "electronic device" is intended to mean any device that operates at least in part on electrical or electronic signals. Non-limiting examples of electronic devices include ICs, printed circuit boards, displays (liquid crystal, thin-film transistor, organic light-emitting, etc.), cell phones, telephone, computers (desktop, laptop, hand-held, workstations, etc.), audio and video equipment, and the like.

The term "remedy" is intended to mean any one or more remedial method or solution and is to be broadly construed. Non-limiting examples of remedies include using a different EDA tool, changing the EDA tool control inputs to change how the design is processed, changing the design flow, changing the design source (e.g., modifying the design, modifying how the design is expressed, changing design constraints, etc.).

The term "symptom" is intended to mean a diagnosed condition of an electronic device at any point in the design flow. Non-limiting, exemplary symptoms include: (1) any design state, such as Register Transfer Level, unmapped gates, mapped gates, placed gates, optimized gates or the like, (2) any exception condition, such as a violation (error) or near violation (warning) of timing, area, electrical, or physical constraints, (3) any quantitative measure of design performance, physical makeup, or electrical integrity, (4) any measure of design progression or processing characteristics, such as, but not limited to cpu-cycles expended per design object, number of trials per design object, timing slack change per unit processing time, timing slack per object within a timing path, memory usage per design object, memory usage per unit time, or (5) any combination of the items within or between any of (1) through (4).

As used herein, the terms "comprises," "comprising," "includes," "including," "has," "having" and any variations thereof, are intended to cover a non-exclusive inclusion. For example, a method, process, article, or apparatus that comprises a list of elements is not necessarily limited to only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is clear that it is meant otherwise.

Figure 2:
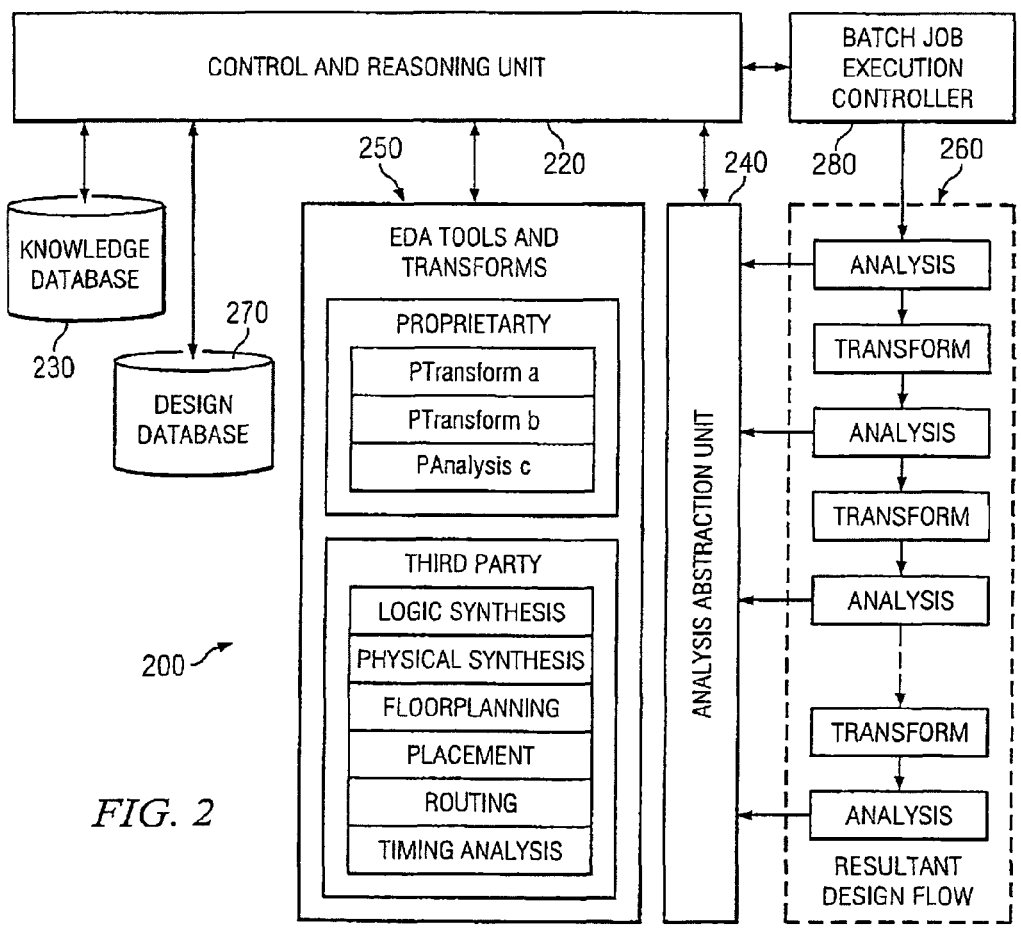
FIG. 2 includes an illustration of an automated electronic device design system in accordance with an embodiment of the present invention.

A high-level description of an electronic device design (hereinafter "design") system 200 is described and illustrated in FIG. 2. In the embodiment illustrated in FIG. 2, system 200 comprises control and reasoning unit (also called "reasoner") 220, which is bidirectionally coupled to knowledge database 230, design database 270, sub-system 250 (that includes EDA tools, and proprietary transform and analysis tools), analysis abstraction unit 240, and batch job execution controller 280. Batch job execution controller 280 can control execution of resultant jobs on a single computer or networked computers. Data from the analysis can be provided to analysis abstraction unit 240.

The design system 200 may include one or more computers. Examples of such computers include client computers, server computers, workstations, and the like. Each computer can include a central processing unit ("CPU"), read-only memory ("ROM"), random access memory ("RAM"), hard drive ("HD") or storage memory, and input/output device(s) ("I/O"). I/O can include a keyboard, monitor, printer, electronic pointing device (e.g., mouse, trackball, stylus, etc.), or the like.

Each computer may have more than one CPU, ROM, RAM, HD, I/O, or other hardware components. Each computer is an example of a data processing system. ROM, RAM, HD, and databases 230 and 270 can include media that can be read by the CPUs of the computers. Therefore, each of these types of memories includes a data processing system readable medium. These memories may be internal or external to the computers.

Portions of the methods described herein may be implemented in suitable software code that may reside within ROM, RAM, or HD. The instructions in an embodiment of the present invention may be contained on a data storage device, such as a hard disk. Alternatively, the instructions may be stored as software code elements on a DASD array, magnetic tape, floppy diskette, optical storage device, or other appropriate data processing system readable medium or storage device.

In an illustrative embodiment of the invention, the computer-executable instructions may be lines of assembly code or compiled C++, Java, or other language code. Other architectures may be used. For example, the functions of any one of the computers may be performed by a different computer. Additionally, a computer program or its software components with such code may be embodied in more than one data processing system readable medium in more than one computer.

In the hardware configuration above, the various software components may reside on a single computer or on any combination of separate computers. In alternative embodiments, some or all of the software components may reside on the same computer.

Communications between any of the computers can be accomplished using electronic, optical, radio-frequency, or other signals. For example, when an operator is at a computer, the computer may convert the signals to a human understandable form when sending a communication to the operator and may convert input from a human to appropriate electronic, optical, radio-frequency, or other signals to be used by that or other computer(s). Similarly, the computer may convert the signals to a human understandable form when sending a communication to the operator.

Attention is now directed to details of automated design system 200 according to an embodiment of the present invention. Design system 200 of FIG. 2 is described and may refer to activities as illustrated in FIG. 3.

Reasoner 220 can provide reasoning across multiple implementation trials of an electronic design, which may be stored in design database 270, and expert design knowledge, which may be stored in knowledge database 230. Reasoner 220 can automatically plan, select, and control (or provide operator guidance to plan, select and control) design automation tools and design automation tool functions for a purpose of more efficiently performing design implementation and verification. Reasoner 220, based on the initial design source and constraints, the target technology, knowledge about certain design constructs used in a design (such knowledge may be derived when used for a number of designs) and knowledge of tool capabilities (in sub-system 250) goes through an iterative process to plan and execute a design flow. At any point during execution, design system 200 can update or improve the design plan based on intermediate results, new input, or any combination thereof.

Reasoner 220 can be implemented using a software program that associates at least one observed symptom with at least one remedy or that associates at least one observed symptom with at least one root cause. Note that many different symptoms may have a common remedy or a common root cause, and a single symptom may have a plurality of remedies or a plurality of root causes. One-to-one, many-to-one, one-to-many, and many-to-many associations between symptoms and remedies or symptoms and root causes are possible. Such information resides in knowledge base 230 and can be used by reasoner 220.

Association of symptoms with remedies or root causes can be implemented using any technique or program that can take observed symptoms and associates and returns at least one remedy or root cause. The following example, in pseudo code, illustrates a non-limiting, exemplary method for implementation of the reasoning of reasoner 220. The following pseudo code takes symptom(s) as input, and returns a list of associated remedies. Symptoms in the following example are represented using a state variable with nonexclusive legal values (RTL, UnmappedGates, Netlist, Placed, Optimized, TimingViolation, RoutingViolation). Remedies can be subprograms that carry out the remedial actions.

```
(Reason (symptoms
        (isRTL (RtnRTLremedies))
        (isUnmpdGates (Rtn UnmpdGateRemedies))
        (isNetlist (Rtn NetlistRemedies))
        (isPlaced (Rtn PlacedRemedies))
        (isOptPlace (RtnOptPlaceRemedies))
        (isTimingViol (RtnTimingViolRemedies))
        (isRoutingViolation (Rtn RouteViolRemedies))
    )
)
```

In this example, if symptom has a value of (Netlist UnmappedGates), then the reasoning program may return the list (NetlistRemedies UnmpdGateRemedies). Evaluation of the list members may yield at least one specific remedial action program that can carry out the remedy, become part of a plan for processing the design, or a combination thereof. In this example, reasoning is implemented as a direct mapping between symptom and stored remedies. Further, prioritization and order may be determined by the order of entry in the program. More sophisticated implementations are also covered by this feature, such as any form of prioritization, or ordered application of remedies that uses stored knowledge, knowledge acquired from an operator, knowledge gained through prior application of the remedies, or any combination thereof.

Knowledge database 230 (also called "knowledge base") is a database for storing expert design and tool knowledge to perform reasoning as described above, including knowledge used by system 200 to analyze and make a decision regarding the design flow and tool usage. The knowledge base 230 can be populated with domain-specific knowledge, which can be input into an ontology or framework. Knowledge database 230 can also be populated automatically with data gathered by running designs through system 200 to gather these metrics about the various designs. For example, a trial solution may be formulated and executed. Regardless whether the trial solution works, system 200 may keep track of that information within knowledge base 230. Subsequent trials formulated by system 200 may use stored success/fail information and may prioritize or exclude a trial based on stored information from past trials.

Knowledge base 230 can be implemented using nearly any software data structures that allow storage of the following types of knowledge:

Noun-verb: Design observations with remedial actions.

Noun-noun: Design observations and associated root cause(s)

Verb-noun: Remedial actions with information on applicability.

Verb: Remedial actions without information on applicability.

Noun-verb knowledge can represent action(s) (verbs) to take when a given design condition (noun) is observed. Noun-verb knowledge may be implemented as observation-action pairs that bind a given design condition or observation with an action. Multiple actions may be bound to a single design condition or multiple design conditions. Additionally, information on a likely outcome may be included to aid in reasoning, described above.

Noun-noun knowledge can represent root causes (nouns) associated with observed symptoms (Nouns). Noun-noun knowledge may be implemented as observation-cause pairs that bind a given symptom to a potential root cause. Additionally, filtering and prioritization of a single or multiple root cause associated with one or more observed symptoms may be performed to prioritize or rank root causes.

Verb-noun knowledge represents actions (verbs) that are applicable to a given design condition (noun). Actions can be references to software routines or programs that modify the design. Verb-noun knowledge contains applicability information that may specify when the action is legal or when it should be applied. Additional information, such as but not limited to a likely outcome, that aids in determining when to use, not to use, or both, for an action may also be supplied in knowledge base 230.

Verb knowledge is actions-only knowledge representing one or multiple methods of performing a given action. Additional information, such as but not limited to likely outcome, that aids in determining when to use, not to use, or both, for an action may also be supplied in knowledge base 230.

Knowledge base 230 can be implemented using software data structures that hold the above information in active memory or inactive memory on a computing system. Additionally, information in knowledge base 230 may be grouped or arranged in one or more memories (e.g., all information stored in persistent storage and frequently-accessed information in volatile cache memory) using any scheme that facilitates better organization, access, association, maintenance, or any combination thereof. The following example provides a non-limiting, exemplary implementation. Note that the example addresses noun-verb, verb-noun, and verb types of information.

```
(Noun-Verb
    (RTL
        (RTL2UnmappedGates
        RTL2MappedGates
        RTL2OptimizedGates
        RTL2PlacedClocked
        RTL2Routed)
    )
    (UnmappedGates
        (UnmappedGates2MappedGates
        UnmappedGates2OptimizedGates
        UnmappedGates2PlacedClocked
        Unmapped2Routed)
    )
    (MappedGates
        (MappedGates2OptimizedGates
        MappedGates2PlacedClocked
        Mapped2Routed)
    )
    (OptimizedGates
        (OptimizedGates2PlacedClocked
        OptimizedGates2Routed)
    )
    (PlacedClocked
        (PlacedClocked2PlacedRouted)
    )
(Verb-Noun
    (RTL2UnmappedGates RTL)
    (RTL2MappedGates RTL)
    (RTL2OptimizedGates RTL)
    (RTL2PlacedClocked RTL)
```

-continued

```
    (RTL2Routed RTL)
    (UnmappedGates2MappedGates UnmappedGates)
    (UnmappedGates2OptimizedGates UnmappedGates)
    (UnmappedGates2PlacedClocked UnmappedGates)
    ...
)
(Verb
    (RTL2UnmappedGates 1)
    (RTL2UnmappedGates 2)
    (RTL2MappedGates 1)
    (RTL2MappedGates 2)
    (RTL2OptimizedGates 1)
    (RTL2OptimizedGates 2)
    (RTL2PlacedClocked 1)
    (RTL2PlacedClocked 2)
    (RTL2Routed 1)
    (RTL2Routed 2)
    (UnmappedGates2MappedGates 1)
    (UnmappedGates2MappedGates 2)
    (UnmappedGates2OptimizedGates 1)
    (UnmappedGates2OptimizedGates 2)
    (UnmappedGates2PlacedClocked 1)
    ...
)
```

Additionally, information for knowledge base 230 may be added or organized to facilitate higher levels of reasoning, such as organizations that facilitate inferring relationships of cause and affect between individual or sets of remedies, or combinations thereof.

Remedies can be used to automatically effect change on a design at any point in the design flow for the purpose of moving a design toward completion, to improve results, to remedy a design problem, or any combination thereof. Remedies can be implemented in software by calling and executing software programs such as, but not limited to functions performed by commercially available EDA tools and proprietary EDA tools or programs. An embodiment is illustrated below where two remedies may be implemented by calling EDA tools with accompanying command scripts/programs that supply inputs to the EDA tools. Comments to the code are surrounded by "**".

```
(RemedialMethod Flatten__Hierarchy
        **call a synthesis tool to flatten
hierarchy**
        InitScript
            **set environment variables, pathnames,
libraries, bind tools, etc.**
            (InputParametersScript do__ungroup__hierarchy)
                synthesis tool command
            (ExitAction nil)
                **upon completion, do not exit or write out
design**
        )
(RemedialMethod RTL2UnmappedGates
            RTL to unmapped Gates synthesis
        Init Script
            **set environment variables, pathnames,
libraries, bind tools, etc.**
            (InputParametersScript do__xform map)
            (ExitAction nil))
                **upon completion, don't exit or write out
design**
```

Sub-system 250 can include a set of EDA tools, and transforms, including off-the-shelf, commercially available, third party EDA tools, and proprietary EDA or other tools. The tools can include programs to do analysis or act as change agents or transforms. Non-limiting examples include physical and logic synthesis tools such as Synopsys's Design Compiler™ and Physical Compiler™, and Cadence's Build Gates™, and Physically Knowledgeable Synthesis™ ("PKS™").

Design database 270 may contain an initial electronic design source code and intermediate and final results for the design. Also, design database 270 may contain the design constraints, and libraries.

The method and system can perform analysis of a design for a purpose of determining a condition of a design in various stages of implementation. Non-limiting examples of different types of analysis include: (1) analysis to determine the state-of-completion of a design (e.g., register transfer level, unmapped structural or Boolean equation, mapped structural, fully or partially placed, fully or partially routed, etc.), (2) analysis to determine the electrical correctness of a design (e.g., driving class errors, slew-rate violations, fanout violations, etc.), (3) analysis to determine constraint compliance (e.g., timing constraints, area constraints, physical constraints, etc.), (4) analysis to isolate state-of-completion, electrical correctness, constraint compliance to a single or multiple design objects, etc., (5) analysis to determine degree of difficulty, identify difficult design regions, for a purpose of predicting the likelihood of success, or (6) any combination of any items within or between those listed in (1) through (5).

The analysis can be performed using EDA tool analysis functions or any method that return metrics relating to the condition of the design and design objects. Analysis abstraction unit 240 post processes the raw data from analysis functions and methods such that the post processed analysis data is actionable by system 200.

Figure 4:
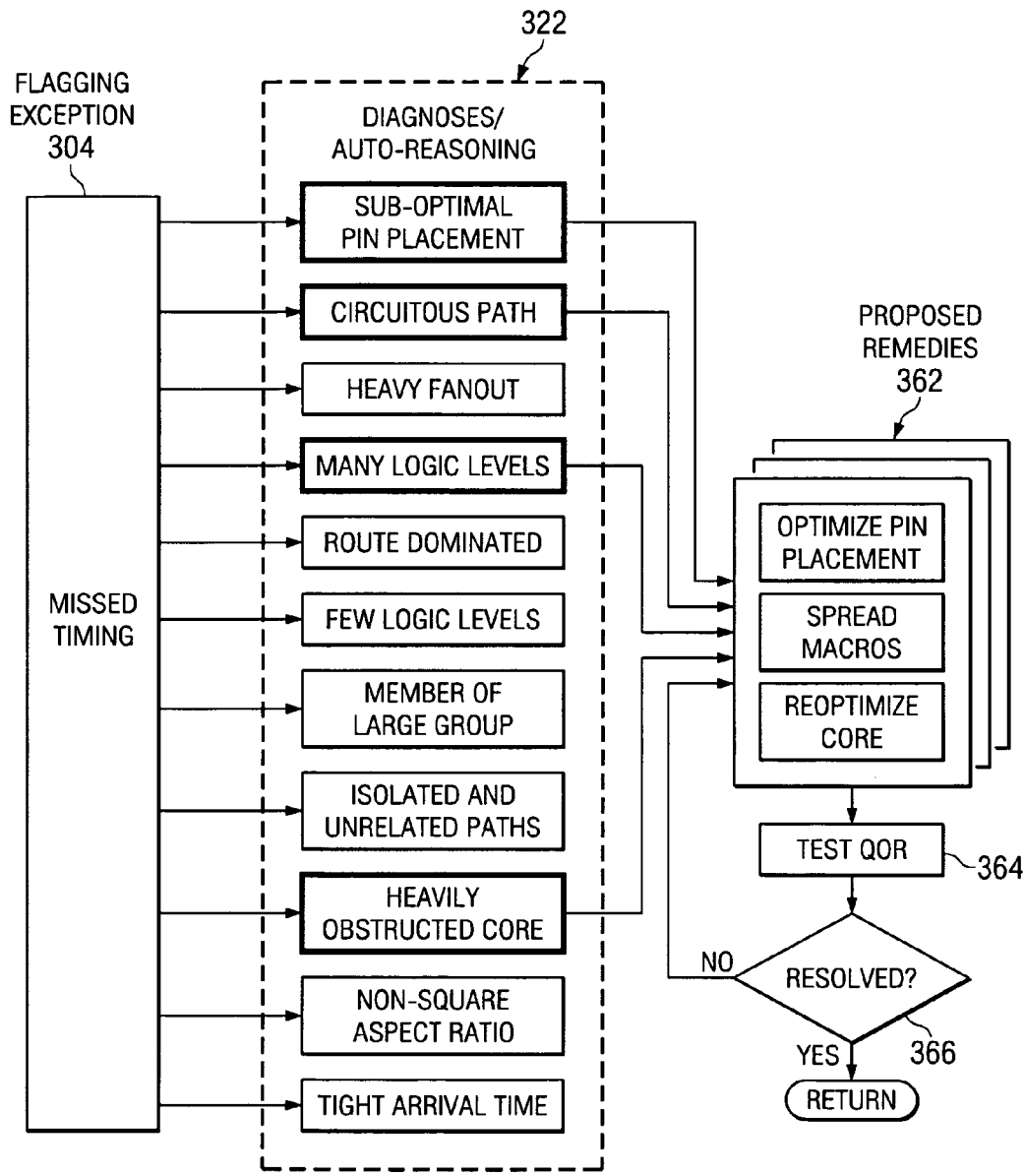
FIG. 4 includes a portion of the process flow diagram of FIG. 3 as used for a specific example.

Algorithmic measurements of electrical characteristics (e.g., a timing report, a congestion report, etc.), which are produced by the EDA tools, may be at a lowest layer. The next layer (above) may be an examination of these algorithmic metrics. The examination is effectively a characterization of the raw data from the lowest layer (e.g., identification of objects associated with the metrics such as instance objects within a path that violates timing, or routes that intersect a congested region, etc.). The analysis may be implemented using a software program that calls capabilities available in commercially available EDA tools, proprietary software programs, or any combination thereof. The following is a list of some analysis that can be performed, but additional analysis can also be performed that return more detailed information about the condition of the design:

report_timing
report_area
report_placement
report_routing_utilization
report_design_format
report_constraints
report_routing_shorts Attention is directed to an exemplary method of using the design system 200 as illustrated in FIGS. 3 and 4. While the design is described with respect to an IC, after reading this specification, skilled artisans will appreciate that the design system 200 may be configured or adapted to be used for designing other types of electronic devices. A brief overview of the method is described before addressing details of portions of the method. FIG. 4 includes a specific example to illustrate better the method illustrated in FIG. 3. The numbers in FIG. 4 refer to corresponding blocks and diamond in FIG. 3 for cross-referencing purposes.

The method can comprise generating data using the design source (block 302), analyzing generated data (block 304), detecting a symptom (block 322), diagnosing a symptom (block 342), and proposing one or more remedies (block 362). The method can continue with testing or executing at least one of the remedies (block 364), determining if the one or more remedies resolve the symptom (diamond 366), and potentially iterating the testing and determination activities. For the purposes of this specification, testing and executing can be used interchangeably, and hereinafter, the term "testing" is used.

Before beginning the method as illustrated in FIG. 3, activities may be performed before submitting files. The automated design method may begin with design system 200 loading a design source into design database 270. Pre-processing may be performed by design system 200 to ensure that the design may be processed using the method. Using proprietary or third party EDA tools in sub-system 250, system 200 can issue commands (e.g., check constraints, check timing, etc.) to determine whether the design source is clean enough to commence processing.

After pre-processing, system 200 can provide expert guidance to an operator in selecting EDA or other tools and setting parameters and options required by those tools for a purpose of more efficiently performing IC design implementation and verification. Alternatively, reasoner 220 may use this information without sending it to an operator or requiring operator intervention and automatically selecting EDA or other tool(s) and other resources within sub-system 250 and determine the sequence of steps for the design process flow.

After pre-processing, reasoner 220 may pass design information from design database 270 and other information, such as a set of trial implementation or analysis jobs, to batch job execution controller 280. Controller 280 controls execution of one or more jobs on a single or networked computing system. During any one or more design implementation acts, the method can comprise generating modified versions of the design from the design source (block 302). Both initial and modified versions of the design source are retained within design database 270. If any changes are made, whether EDA or other tools, design source, etc., reasoner 220 can determine which steps should be performed and their order. Note that the steps may be the same or different, the steps may be performed in a different order, or the like.

Throughout the design process, all data, including intermediate designs and analysis data, may be retained in the design database 270 or in other memory. One of the characteristics of system 200 is its ability to backtrack over previous design results and pick up an intermediate result from an earlier point and establish a thread of execution from that point forward. The backtracking will be described later, some of that information may become more important, particularly if a selection of a remedy at an early decision point appears to be poor at a later step.

In addition to a completed design, design system 200 can produce a recipe to reproduce the result from the original design source.

The method can further comprise analyzing the generated data (block 304 in FIG. 3). After at least some of the analysis is performed, the method may comprise detecting a symptom (block 322). In a specific example in FIG. 4, the symptom, which is a flagged exception, may be missed timing. The analysis data and symptom may be forwarded to the reasoner 220.

The method can further comprise diagnosing the symptom (block 342). The diagnosis may be performed by the reasoner 220. The diagnosis may be performed using information from knowledge database 220 and information from the analysis abstraction unit 240. FIG. 4 includes a number of potential root causes for missed timing. The potential root causes include sub-optimal pin placement, circuitous path, heavy fanout, etc.

The method can also comprise proposing one or more remedies (block 362 in FIG. 3). Reasoner 220 can use information provided by unit 240 and access information from knowledge database 230 and design database 270. The reasoner 220 with this information effectively acts as an expert designer and an expert EDA or other tool specialist knowing the limitations and idiosyncrasies of the design and EDA or other tools to identify more likely root causes of the symptom. Referring to FIG. 4, sub-optimal pin placement, circuitous path, many logic levels, and heavily obstructed core are identified as the more likely root causes compared to heavy fanout, route dominated, few logic levels, etc.

After identifying the more likely root causes, reasoner 220 proposes one or more remedies that correspond to the more likely root causes. In FIG. 4, proposed remedies include optimize pin placement, spread macros, and reoptimize core. Note that the number of proposed remedies may be the same, more, or fewer than the number of more likely root causes. In this example, the number of proposed remedies is less than the number of more likely root causes. Further, reasoner 220 may generate proposed remedies for the less likely root causes, however the system prioritizes execution such that remedies for the more likely root causes are executed before the remedies for the less likely root causes, thereby improving efficiency and reducing design cycle time.

In one embodiment not shown, the method can further comprise sending the proposed remedies to an operator of design system 200. The operator may employ this information to control subsequent system behavior. Alternatively, the method can continue in its automated manner.

The method can optionally continue with testing at least one of the proposed remedies (block 364) and determining if the one or more proposed remedies resolve the symptom (diamond 366). The testing and determination activities may be iterated for one, some, or all of the proposed remedies. Alternatively, any two or more of the proposed remedies may be tested in parallel (simultaneously).

In still another alternative embodiment, testing may be iterated for all proposed solutions, regardless whether a prior proposed solution resolved the remedy. Referring to FIG. 3, "Resolved?" could be replaced by "Last Proposed Remedy?".

In one embodiment, testing may stop after one proposed remedy is determined to resolve the symptom ("Yes" branch of diamond 366). Testing of another proposed remedy is performed if the symptom is not resolved ("No" branch of diamond 366). Although not illustrated, the method may potentially stop if none of proposed remedies are determined to resolve the symptom. At this point, other less likely remedies may be tested, or the operator may be requested to intervene. The method may or may not stop when the less likely remedies are tested or operator intervention is requested.

In still another embodiment, design system 200 may determine or otherwise anticipate that testing at least one of the proposed remedies will take a long time (e.g., computer time (CPU cycles)), hereinafter called "complicated remedy." Design system 200 may defer testing the complicated remedy until other proposed remedies, if any, do not resolve the symptom. Design system 200 may automatically test the complicated remedy, or design system 200 may inquire if the operator wants the design system 200 to proceed with testing the complicated remedy. Optionally, a warning may be sent to the operator notifying him or her of the automatic testing of the complicated remedy or when the inquiry is sent to the operator. The warning may comprise information that testing the complicated remedy may consume a lot of computer resources or may otherwise take a long time to perform.

After testing is completed, the output from reasoner 220 may be highly varied. Design system 200 may send a message to the operator with the list of proposed remedies and may list them in order of preference or may only list one of the proposed remedies. Reasoner 220 may select a different EDA or other tool to help with the design or automatically write or modify a script file (or direct another portion of design system 200 to write or modify such script file), modify the design source, dynamically change the design flow to add, delete, replace, reorder steps, or any combination thereof. If other symptoms occur, the process flow as previously described may be performed.

Optionally, design system 200 may reexamine the process flow to determine if resultant design flow 260 (in FIG. 2) is to be changed, updated, or improved. If so, the method can further comprise changing the subsequent design flow using design system 200. This dynamic changing of the design flow by the design system 200 without any human intervention is not seen with commercially available EDA tools. Knowledge base 230 may include information regarding the tools in sub-system 250 and their interfaces, communications protocols, input and output formats, control language specifications, operating environments, and performance characteristics, etc. to allow reasoner 220 to communicate effectively with the different parts of sub-system 250. Conventional tools and methods take a predetermined, static flow and execute it completely or partially based on dependency; they do not dynamically formulate flows or automatically modify design flows. Human intervention would be required to change the design flow. This ability of design system 200 can be implemented using information within databases 230 and 270 and logic (i.e., software application) running on reasoner 220. The revised resultant design flow may be sent to batch job execution controller 280 and analysis abstraction unit 240. The further analysis of the design with the remedy may continue pursuant to the revised resultant design flow.

After the designing method is completed, the method can further comprise manufacturing the electronic device in accordance with the design. Testing of the manufactured electronic device may be performed to confirm that the electronic device meets its specification targets.

Another specific example is given to highlight other aspects of the system and method. In this example, analysis may be performed on timing. A check timing command may generate many warnings and error messages. Using the design-specific and knowledge about the tools used to run the check commands (contained in knowledge database 230), design system 200 can determine root cause(s) and give specific guidance on how to modify or correct constraints as a remedy.

Alternatively, design system 200 may also recommend a remedial action to improve the design source. For example, a log file may have warnings that 6,000 flip flops in the design are receiving data when a clock signal was expected. This type of error message or warning may occur when using Build Gates™ when running check timing command.

Reasoner 220 reviews the design source and the knowledge of EDA tool used, and determines that typically this is a clock-gating logic problem. Reasoner 220 can then instruct an EDA tool in sub-system 250 to determine if there is a common point between these 6,000 instances where the warnings are present. Thus, for this type of warning message, reasoner 220 can review knowledge database 230 to find the implications of the warning message or possible causes.

Knowledge database 230 has information about clock definitions or rules about debugging this type of symptom and will trace back from those 6,000 end points to find out if there is a common point or a small set of common points as a root cause of the symptoms. In this example, a clock constraint could be missing, or it could be somewhere downstream or upstream of that point where it is blocked by the logic. The EDA tool, Build Gates™, may only be able to handle certain propagation of clocks through certain logic.

After design system 200 finds the clock attachment point, the clock attachment point may be moved or changed. This illustrates one example of the level of detailed guidance that the system 200 can give to an operator.

In one embodiment, design system 200 could see this error message and immediately scan back from all of those points and give the operator a list of potential problem points. In more advanced embodiments, design system 200 can be layered to give higher levels of hypothesis forming and solutions. For example, instead of just taking a reflex-like action of examining the data and putting a clock nearby, a higher level behavior would recognize that the problem is normally caused by a clock definition problem. Design system 200 may search for misplaced clock-specifications or totally erroneous ones, then recommend or automatically repair the some or all instances of the problem.

Design system 200 can also allow for backtracking to an earlier decision point and selecting a different proposed remedy as illustrated in FIG. 5 (described with reference to the prior figures, and particularly FIG. 4). The method of designing an electronic device is performed using design system 200, where a first symptom occurs, such as the missed timing exception as illustrated in FIG. 4. The method at this point may be represented by circle 502 in FIG. 5. After the analysis and diagnosis as previously described and illustrated in FIG. 4, three proposed remedies may include optimize pin placement, as represented by circle 512 in FIG. 5, spread macros, as represented by circle 514, and reoptimize core, as represented by circle 516. After testing, design system 200 may determine that optimizing pin placement (circle 512) is the best of the three proposed remedies and is selected. Referring to FIG. 5, circle 502 represents a first decision point where a proposed remedy is selected and connected with a solid arrow to circle 512. The dashed arrows to circles 514 and 516 represent proposed remedies that were not selected at the first decision point.

The method continues with additional analysis or other design activities represented by circles 512, 522, and 532. All data collected during the design method, including unselected proposed remedies 514 and 516 and their corresponding test data, are retained in memory (e.g., the knowledge database 230 or design database 270).

A second symptom occurs, such as too much congestion, missed timing, or an exception, or warning condition, or any combination thereof. The method at this point may be represented by circle 532 in FIG. 5. After the analysis and diagnosis, as previously described, four proposed remedies may be represented by circles 542, 544, 546, and 548. After testing, design system 200 determines that none of these proposed remedies are feasible for any number of reasons (e.g., does not work, allows too little margin or causes a more severe adverse side effect, etc.). At this point, design system 200 may determine that the proposed remedy, as illustrated by circle 512, does not work satisfactorily for any number of reasons. Note that valuable information may still be gained from the failed path using the optimized pin placement (circle 512) and can be stored for later use.

Design system 200 can effectively utilize the information gained from traversing a failed path to effectively backtrack and, in one embodiment, formulate, a new proposed remedy (represented by circle 572) using information learned from the failed path. The new remedy may be selected and tested or executed.

Referring to FIG. 5, the backtracking and selection is represented by the solid line from circle 532 to circle 572. Similar to an embodiment previously described, reasoner 220 can dynamically change resultant process flow 260 to take advantage of intermediate and final results to formulate better design flow steps from all available versions of the design or steps. Referring to FIG. 5, instead of proceeding to circle 522, the method proceeds to another step represented by circle 582 and then to yet another step represented by circle 592. The method can continue for steps that are not illustrated in FIG. 5.

In still another alternative embodiment, design system 200 can backtrack and formulate and select a different proposed remedy from the earlier decision points, which for this example could be reoptimizing the core (circle 516). Because all the data during the design process was saved, the test data from reoptimizing the core should be readily available from memory (may not need to be generated or regenerated). The reoptimizing the core as originally formulated (represented by circle 516) may or may not be an optimal solution. In one embodiment, reoptimizing the core (circle 516) is not affected by the information from failed path, and the process can proceed to circle 516. In still another alternative embodiment (not shown), reoptimizing the core (circle 516) may be modified based on information gained from the failed path, and the modified version of reoptimizing the core may be selected and tested.

In other embodiments, many other alternatives are possible. For example, backtracking does not need to occur at a subsequent decision point. For example, at the step represented by circle 522, design system 200 may conclude that the proposed remedy 512 is infeasible and backtrack at this point rather than waiting until the step represented by circle 532 is reached. Alternative path with circles 516 and 562 may be processed in parallel with the path having circles 512, 522, and 532. In another embodiment, the resultant design flow after proposed remedy represented by circle 516, may be the same as the one from circle 512 or include a combination thereof (go to circle 562 then to circle 532). To list every conceivable permutation would be nearly impossible.

If the user of the method and system has sufficient resources, the method and system can be used to process along different remedy paths simultaneously. For example, remedies corresponding to circles 512 and 516 may be tested simultaneously. If the remedy corresponding to circle 516 becomes more promising than the remedy corresponding to circle 512, some or all of the resources committed to the remedy of circle 512 may be redirected or reallocated to the remedy of circle 516. Such redirection or reallocation can be accomplished by switching the priorities of the remedies.

Embodiments of the present invention have many advantages over conventional prior art automated design systems. Knowledge database 230 includes information regarding idiosyncrasies or other unique aspects of both the design and the various tools (EDA tools, techniques, and transforms), and logical and physical technology libraries. Additionally, knowledge base 230 can include data on the interaction between the two (how a specific design and tool interact with each other). Electronic device designers, particularly less experienced ones, may not know of these interactions, and EDA tool vendors may not have information on how specific types of designs work or do not work with their tool. Such information may only be known by more experienced engineers, which may already be very busy and overburdened. Design system 200 can provide expert guidance, thus allowing less experienced designers to learn workable solutions faster and to increase their design efficiency.

The design system 200 can dynamically change a resultant design flow as circumstances warrant. Steps that may have been originally needed may become unnecessary, or steps that were not originally included in a design flow may be added. In this manner, an electronic device can be designed, manufactured and delivered to market sooner while profits margins are relatively high without having to discover problems during manufacturing, or worse, after a customer receives the electronic device.

The ability to use data from completed or tested intermediate or final design steps to automatically backtrack to one or more prior unselected proposed remedies is unavailable in conventional systems. Referring to FIG. 5, a first EDA tool, or tool command may be used at decision point 501 to select remedy 512. A second EDA tool or tool command may be used at decision point 532.

The system and method can be used to identify more likely remedies to be tested rather than testing every potential remedy, as one conventional system does. Testing takes time and consumes valuable computer resources. Design time and computer resources may be conserved because potential remedies that are unlikely to work or are clearly inferior to other potential remedies are not tested. In this manner, the method and system described herein more intelligently uses limited resources in a more efficient manner.

Along similar lines, the method and system described herein can propose remedies that are easier to test before performing complicated testing of one or more of the proposed remedies begin. The method and system allow great flexibility to select one of the proposed remedies before complicated testing begins or finishes, automatically perform the complicated testing, or request input from an external source (e.g., a operator) before beginning or continuing with complicated testing.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A computer-implemented method of designing an electronic device, comprising:
    reading a design source into a design system, wherein the design system comprises one or more computers operating in a network environment, wherein the design source comprises design files and design constraint files used in a design of the electronic device;
    generating data using the design source;
    analyzing the generated data;
    detecting a symptom of the design of the electronic device based on analysis data from the analyzing step;
    proposing at least one remedy associated with the symptom;
    testing the at least one remedy;
    determining if the at least one remedy resolves the symptom;
    repeating the proposing and testing steps if the symptom is not resolved; and
    after the testing is completed or stopped, performing:
        automatically writing or modifying a script file;
        modifying the design source;
        dynamically changing a design flow; or
        a combination thereof.

2. The computer-implemented method of claim 1, wherein modifying the design source comprises modifying the design of the electronic device, modifying how the design is expressed, changing one or more design constraints, or a combination thereof.

3. The computer-implemented method of claim 2, further comprising manufacturing the electronic device in accordance with the modified design.

4. The computer-implemented method of claim 1, further comprising manufacturing the electronic device in accordance with the design flow.

5. The computer-implemented method of claim 1, wherein reading the design source into the design system further comprises loading the design source into a design database accessible by the design system.

6. The computer-implemented method of claim 1, further comprising diagnosing the symptom, wherein diagnosing the symptom comprises identifying one or more root causes of the symptom.

7. The computer-implemented method of claim 1, further comprising sending a message to an operator with a proposed remedy or a list of proposed remedies in order of preference.

8. The computer-implemented method of claim 1, wherein two or more remedies are proposed, further comprising prioritizing the two or more remedies.

9. A computer-implemented method of designing an electronic device, comprising:
    reading a design source into a design system, wherein the design system comprises one or more computers operating in a network environment, wherein the design source comprises design files and design constraint files used in a design of the electronic device;
    analyzing data generated based on the design source;
    detecting a symptom before reaching a decision point;
    proposing a first remedy and a second remedy;
    testing or executing the first remedy and the second remedy, wherein the first remedy has a higher priority compared to the second remedy;
    switching priorities, so that the second remedy has a higher priority compared to the first remedy; and
    performing or recommending the second remedy to improve the design source.

10. The computer-implemented method of claim 9, wherein the priorities are switched based upon the execution of the first remedy and the second remedy.

11. The computer-implemented method of claim 10, determining that the second remedy is more promising than the first remedy.

12. The computer-implemented method of claim 11, wherein switching priorities comprises reallocating at least one resource from the first remedy to the second remedy.

13. The computer-implemented method of claim 9, further comprising modifying a device design based on the first remedy or the second remedy.

14. The computer-implemented method of claim 9, further comprising selecting the second remedy at the decision point.

15. A data processing system readable storage medium having code embodied therein, the code comprising:
- an instruction for reading a design source into a design system, wherein the design system comprises one or more computers operating in a network environment, wherein the design source comprises design files and design constraint files used in a design of the electronic device;
- an instruction for analyzing data generated based on the design source;
- an instruction for detecting a symptom before reaching a decision point;
- an instruction for proposing a first remedy and a second remedy;
- an instruction for testing or executing the first remedy and the second remedy, wherein the first remedy has a higher priority compared to the second remedy;
- an instruction for switching priorities, so that the second remedy has a higher priority compared to the first remedy; and
- an instruction for performing or recommending the second remedy to improve the design source.

16. The data processing system readable storage medium of claim 15, wherein the priorities are switched based upon the execution of the first remedy and the second remedy.

17. The data processing system readable storage medium of claim 16, further comprising an instruction for determining that the second remedy is more promising than the first remedy.

18. The data processing system readable storage medium of claim 17, wherein switching priorities comprises reallocating at least one resource from the first remedy to the second remedy.

19. The data processing system readable storage medium of claim 15, further comprising an instruction for modifying a device design based on the first remedy or the second remedy.

20. The data processing system readable storage medium of claim 15, further comprising an instruction for selecting the second remedy at the decision point.

* * * * *